United States Patent
Nojima et al.

(10) Patent No.: US 10,563,093 B2
(45) Date of Patent: Feb. 18, 2020

(54) COMPOSITION FOR FORMING DENSE SILICEOUS FILM

(71) Applicant: AZ Electronic Materials (Luxembourg) S.a.r.l., Luxembourg (LU)

(72) Inventors: Yoshio Nojima, Kakegawa (JP); Masakazu Kobayashi, Kakegawa (JP)

(73) Assignee: AZ Electronic Materials (Luxembourg) S.a.r.l., Luxembourg (LU)

(*) Notice: Subject to any disclaimer, the term of this patent is extended or adjusted under 35 U.S.C. 154(b) by 0 days.

(21) Appl. No.: 16/096,116

(22) PCT Filed: Apr. 28, 2017

(86) PCT No.: PCT/EP2017/060190
§ 371 (c)(1),
(2) Date: Oct. 24, 2018

(87) PCT Pub. No.: WO2017/191049
PCT Pub. Date: Nov. 9, 2017

(65) Prior Publication Data
US 2019/0136088 A1 May 9, 2019

(30) Foreign Application Priority Data
May 2, 2016 (JP) .................................. 2016-092672

(51) Int. Cl.
C08F 2/48 (2006.01)
C08J 7/18 (2006.01)
C09D 183/16 (2006.01)
C08G 77/62 (2006.01)
C08L 83/16 (2006.01)
H01L 21/02 (2006.01)

(52) U.S. Cl.
CPC ........... C09D 183/16 (2013.01); C08G 77/62 (2013.01); C08L 83/16 (2013.01); H01L 21/02126 (2013.01)

(58) Field of Classification Search
CPC ........ C09D 183/16; C08G 77/62; C08K 5/17; C08L 83/16; H01L 21/02126
USPC .................. 427/508, 506, 459, 110
See application file for complete search history.

(56) References Cited

U.S. PATENT DOCUMENTS

| 3,892,583 A | 7/1975 | Winter et al. |
| 4,840,778 A | 6/1989 | Arai et al. |
| 5,494,978 A | 2/1996 | Shimizu et al. |
| 6,310,168 B1 | 10/2001 | Shimizu et al. |
| 6,756,469 B2 | 6/2004 | Lukacs, III |
| 8,263,717 B2* | 9/2012 | Ozaki ..................... C08K 5/17 427/331 |
| 9,896,764 B2* | 2/2018 | Ozaki ................. C23C 18/1208 |
| 2008/0102211 A1* | 5/2008 | Matsuo ................ C09D 183/16 427/340 |
| 2010/0234540 A1 | 9/2010 | Ozaki |
| 2015/0252222 A1 | 9/2015 | Ozaki et al. |
| 2017/0218114 A1* | 8/2017 | Kasemi ............. C08G 59/5033 |
| 2018/0079710 A1* | 3/2018 | Kasemi ................ C07C 215/50 |
| 2019/0040253 A1* | 2/2019 | Kasemi ................. C09J 175/08 |

FOREIGN PATENT DOCUMENTS

| JP | S4969717 A | 7/1974 |
| JP | S6189230 A | 5/1986 |
| JP | S63016325 B2 | 4/1988 |
| JP | H01138107 A | 5/1989 |
| JP | H01138108 A | 5/1989 |
| JP | H01203429 A | 8/1989 |
| JP | H01203430 A | 8/1989 |
| JP | H02175726 A | 7/1990 |
| JP | H0331326 A | 2/1991 |
| JP | H03320167 | 4/1991 |
| JP | H0463833 A | 2/1992 |
| JP | H0586200 A | 4/1993 |
| JP | H05331293 A | 12/1993 |

(Continued)

OTHER PUBLICATIONS

Burkhardt et al, WO 2017/1406874 Machine Translation, Aug. 24, 2017 (Year: 2017).*

(Continued)

Primary Examiner — Jessica Whiteley
(74) Attorney, Agent, or Firm — Drinker Biddle & Reath LLP

(57) ABSTRACT

[Object] To provide a polysilazane-containing composition for forming a film. In order to form a dense and processable siliceous film, the composition is intended to be employed in a two-step conversion process comprising the steps of: forming a film having a dry surface from the composition provided that the conversion in to the siliceous substance proceeds insufficiently; and then subjecting the film to secondary processing. [Means] The present invention provides a polysilazane-containing film-forming composition comprising a particular amine compound, a polysilazane compound, and a solvent; and the invention also provides a process for forming a siliceous substance. In the process, the composition is applied to coat a substrate and thereafter converted into the siliceous substance. The particular amine compound has two amine groups, and the amine groups have at least one phenyl-substituted hydrocarbon group.

13 Claims, 1 Drawing Sheet

(56) References Cited

FOREIGN PATENT DOCUMENTS

| JP | H05345826 A | 12/1993 | | |
|---|---|---|---|---|
| JP | H08176511 A | 7/1996 | | |
| JP | H08176512 A | 7/1996 | | |
| JP | H0931333 A | 2/1997 | | |
| JP | H1160736 A | 3/1999 | | |
| JP | H11116815 A | 4/1999 | | |
| JP | 2004536196 A | 12/2004 | | |
| JP | 2009111029 A | 5/2009 | | |
| WO | WO-2011027826 A1 | * | 3/2011 | ......... C23C 18/1208 |
| WO | WO-2016023839 A1 | * | 2/2016 | ......... C08G 59/5033 |
| WO | WO-2017140687 A1 | * | 8/2017 | ............. C08G 59/56 |

OTHER PUBLICATIONS

International Search Report for PCT/EP2017/060190 dated Jun. 30, 2017.

Seyferth, D., et al., "High-Yield Synthesis of $Si_3N_4$/SiC Ceramic Materials by Pyrolysis of a Novel Polyorganosilazane", Communications of the American Ceramic Society, vol. 67, No. 7, (1984), pp. C-132-C-133.

Seyferth, D., et al., "Polysilazane Routes to Silicon Nitride", Polymer Preprints, Division of Polymer Chemistry, American Chemical Society, vol. 25, No. 10, (1984), pp. 10-12.

Seyferth, D., et al., "A Liquid Silazane Precursor to Silicon Nitride", Communications of the American Ceramic Society, vol. 66, No. 1, (1983), pp. C13-C14.

Written Opinion of the International Searching Authority for PCT/EP2017/060190 dated Jun. 30, 2017.

* cited by examiner

COMPOSITION FOR FORMING DENSE SILICEOUS FILM

CROSS-REFERENCE TO RELATED APPLICATIONS

This application is a national application (under 35 U.S.C. § 371) of PCT/EP2017/060190, filed Apr. 28, 2017, which claims benefit of Japanese Application No. 2016-092672, filed May 2, 2016, both of which are incorporated herein by reference in their entirety.

TECHNICAL FIELD

This invention relates to a composition containing a polysilazane compound. In detail, the present invention relates to a composition from which a dense siliceous film can be formed by a two-step conversion process.

BACKGROUND ART

Polysilazane compounds can be generally converted into siliceous substances by heating. However, if normal polysilazane compounds are simply used, they have many problems that should be improved. For example, the conversion into the siliceous substances proceeds very slowly and needs high temperature. Since there is thus large room for improvement, various studies and researches have been made to overcome the problems.

In order to improve the above problems, it is proposed to modify the polysilazane compounds themselves or to incorporate particular additives into compositions containing polysilazane compounds. For example, an N-heterocyclic compound (described in, for example, Patent document 1), an alkanol amine (described in, for example, Patent document 2) or an amine and/or acid (described in, for example, Patent document 3) is added as the additive into a polysilazane-containing composition so that the composition can form a siliceous film at a low temperature. The amine compounds described as the additives in the above documents are also used in a composition containing a diamine compound for other purposes such as reducing film-roughness or avoiding coating-unevenness (described in, for example, Patent documents 4 and 5), and further they are still also used in a composition containing a polyamine compound for the purpose of hardening epoxy resin (described in, for example, Patent document 6).

Lately, applications of siliceous films formed from polysilazane-containing compositions have been expanding. In accordance with that, various processing methods thereof have been researched. For example, a method is developed that comprises the steps of: forming a siliceous coating layer on a substrate, forming another layer thereon to overlap the coating layer, and subjecting the overlapping layer to secondary processing. If a conventional polysilazane-containing composition is employed in this method, the conversion reaction proceeds rapidly and almost finishes before the overlapping layer is formed thereon. Consequently, when once the overlapping layer is formed, it is often difficult to carry out various secondary processing treatments for forming a dense siliceous film from the coating layer. On the other hand, however, if the polysilazane composition is completely prevented from undergoing the conversion reaction in view of the secondary processing, the surface of the composition spread on the substrate is not cured and hence the coating layer of the composition cannot be fixed on the substrate. As a result, the substrate coated with the composition is difficult to handle in practice. For example, if a resin film is adopted as the substrate, it is impossible to wind up the resin-film substrate coated with the polysilazane composition.

In consideration of the above, it is desired for the conversion reaction of the polysilazane composition not to finish completely but to proceed to such a degree that the surface of the composition layer can be dried enough to keep the layer fixed on the substrate. However, conventional polysilazane compositions are produced with the aim of making the conversion reaction proceed as completely as possible, and accordingly the conversion reaction cannot be kept unfinished for a certain period.

PRIOR ART DOCUMENTS

Patent Documents

[Patent document 1] Japanese Patent Laid-Open No. H11(1999)-116815
[Patent document 2] Japanese Patent Laid-Open No. H11(1999)-60736
[Patent document 3] Japanese Patent Laid-Open No. H9(1997)-31333
[Patent document 4] Japanese Patent Laid-Open No. H8(1996)-176511
[Patent document 5] Japanese Patent Laid-Open No. H8(1996)-176512
[Patent document 6] Japanese Patent Laid-Open No. 2004-536196
[Patent document 7] Japanese Patent Publication No. S63(1988)-16325
[Patent document 8] Japanese Patent Laid-Open No. S61(1986)-89230
[Patent document 9] Japanese Patent Laid-Open No. S49(1974)-69717
[Patent document 10] Japanese Patent Laid-Open No. H1(1989)-138108
[Patent document 11] Japanese Patent Laid-Open No. H1(1989)-138107
[Patent document 12] Japanese Patent Laid-Open No. H1(1989)-203429
[Patent document 13] Japanese Patent Laid-Open No. H1(1989)-203430
[Patent document 14] Japanese Patent Laid-Open No. H4(1992)-63833
[Patent document 15] Japanese Application No. H3(1991)-320167, which corresponds to Japanese Patent Laid-Open No. H5(1993)-345826
[Patent document 16] Japanese Patent Laid-Open No. H2(1990)-175726
[Patent document 17] Japanese Patent Laid-Open No. H5(1993)-86200
[Patent document 18] Japanese Patent Laid-Open No. H5(1993)-331293
[Patent document 19] Japanese Patent Laid-Open No. H3(1991)-31326
[Patent document 20] Japanese Patent Laid-Open No. 2009-111029

Non-Patent Documents

[Non-patent document 1] D. Seyferth et. al., Communication of Am. Cer. Soc., C-13, Jan. 1983
[Non-patent document 2] D. Seyferth et. al., Polym. Prepr. Am. Chem. Soc., Div. Polym. Chem., 25, 10(1984)

[Non-patent document 3] D. Seyferth et. al., Communication of Am. Cer. Soc., C-132, Jul. 1984

DISCLOSURE OF INVENTION

Problem to be Solved by the Invention

In order to solve the aforementioned problem, it can be thought to adopt a two-step conversion process capable of forming a dense and processable siliceous film. That process comprises, for example, the steps of: forming a film having a dry surface from a polysilazane composition, and thereafter carrying out secondary processing treatments for forming a dense siliceous film.

In view of the above background, the present invention aims to provide a polysilazane composition capable of undergoing a two-step conversion process in which a coating layer is formed, kept fixed on a substrate, and then subjected to secondary processing treatments so as to form a dense siliceous film.

Means for Solving Problem

The present invention provides a composition comprising:
an amine compound represented by the following formula (I):

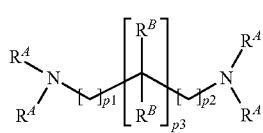

(in which
each $R^A$ is independently hydrogen or a substituted or unsubstituted $C_1$-$C_{10}$ hydrocarbon group provided that at least one $R^A$ is a phenyl-substituted $C_1$-$C_3$ hydrocarbon group,
each $R^B$ is independently hydrogen, $C_1$-$C_{10}$ hydrocarbon group, cyclic hydrocarbon group or unsaturated hydrocarbon group provided that both $R^B$s are not hydrogens at the same time,
each of p1 and p2 is independently an integer of 0 to 3, and p3 is an integer of 1 to 3);
a polysilazane compound;
and
a solvent.

The present invention also provides a process for forming a siliceous film, which comprises the steps of: coating a substrate with the above composition to form a film having surface dryness, and then subjecting the film to a treatment selected from the group consisting of heat treatment, humidifying treatment, light irradiation treatment, UV-ozone treatment, plasma treatment, corona treatment, electron beam treatment, and combinations thereof.

Effect of the Invention

The composition according to the present invention can form a film having surface dryness (hereinafter, often referred to as "dry-surface film" for simplification). The film can be kept remaining in that state, and hence can be thereafter subjected to secondary processing to form a dense siliceous film. Thus, the composition of the present invention can undergo a two-step conversion process. Since having surface dryness, the dry-surface film is easy to handle. Further, it is possible to increase the content of the siliceous substance in the resultant film by increasing the amount of the amine compound in the composition according to the present invention. In addition, the composition of the present invention has favorable coating properties.

BEST MODE FOR CARRYING OUT THE INVENTION

Composition

Figure 1:
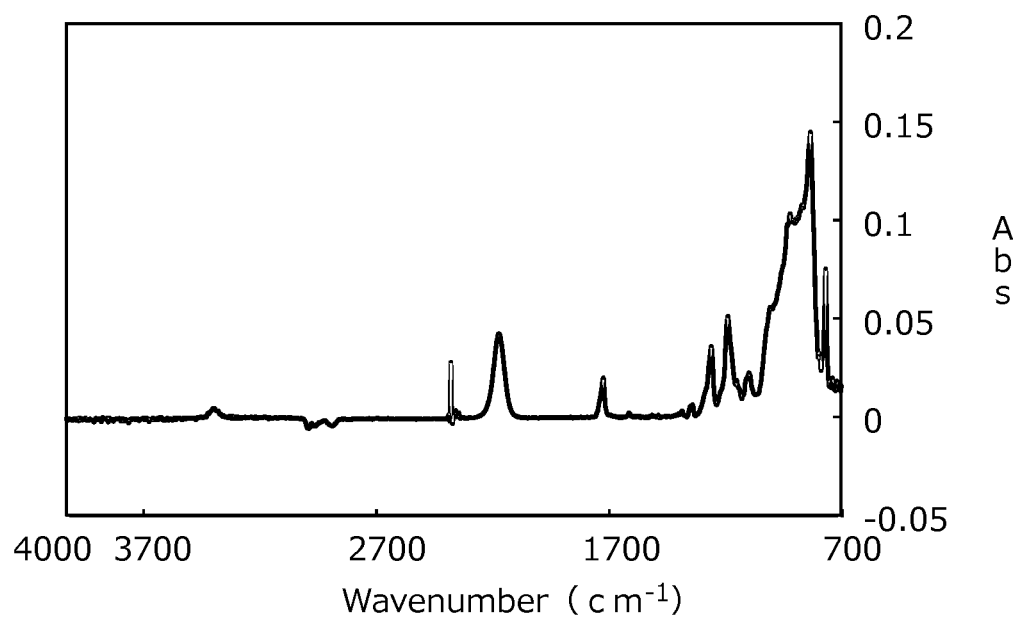
FIG. 1 shows a typical IR spectrum of a film containing a small amount of the siliceous substance.

The composition according to the present invention comprises: a particular amine compound, a polysilazane compound, and a solvent. Those ingredients contained in the composition will be individually explained below in detail.

(A) Amine Compound

The composition of the present invention contains a particular amine compound. This particular amine compound used in the present invention is represented by the following formula (I):

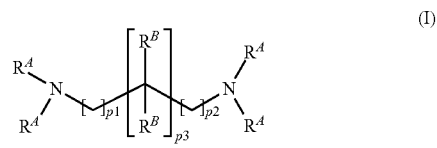

(in which
each $R^A$ is independently hydrogen or a substituted or unsubstituted $C_1$-$C_{10}$ hydrocarbon group provided that at least one $R^A$ is a phenyl-substituted $C_1$-$C_3$ hydrocarbon group,
each $R^B$ is independently hydrogen, $C_1$-$C_{10}$ hydrocarbon group, cyclic hydrocarbon group or unsaturated hydrocarbon group provided that both $R^B$s are not hydrogens at the same time,
each of p1 and p2 is independently an integer of 0 to 3, and p3 is an integer of 1 to 3).

Examples of $R^A$ in the formula (I) include: hydrogen atom; of $C_1$-$C_{10}$ hydrocarbon groups, such as, methyl, ethyl, and propyl; cyclic hydrocarbon groups, such as, cyclohexyl and cyclopentyl; and unsaturated hydrocarbon groups, such as, vinyl, aryl, and prenyl. Preferably, at least one of $R^A$s is a phenyl-substituted of $C_1$-$C_3$ hydrocarbon group, and more preferably, one or two of $R^A$s are benzyl groups. The $R^A$s other than benzyl groups are preferably hydrogen atoms or short-chain hydrocarbon groups, such as, methyl groups.

Examples of $R^B$ in the formula (I) include: hydrogen atom; $C_1$-$C_{10}$ hydrocarbon groups, such as, methyl, ethyl, and propyl; cyclic hydrocarbon groups, such as, cyclohexyl and cyclopentyl; and unsaturated hydrocarbon groups, such as, vinyl, aryl, and prenyl. Preferably, each $R^B$ is independently hydrogen or $C_1$-$C_3$ hydrocarbon group. More preferably, one of $R^B$s is methyl and another of $R^B$s is hydrogen.

The above amine compound is a derivative of diamine, such as, ethylenediamine, propylenediamine, trimethylenediamine, 1,2-butanediamine, 1,3-butanediamine, or 1,4-butanediamine. The amine compound is particularly preferably selected from the group consisting of N,N'-dibenzylethylenediamine, N,N'-dibenzyl-N-methyl-ethylenediamine, N-benzyl-N,N'-dimethylethylenediamine, N,N'-dibenzyl-N,N'-dimethylethylenediamine, N-benzyl-2-methyl-1,3-propanediamine, and N,N'-dibenzyl-2-methyl-1,3-propanediamine.

Those amine compounds can be used in combination of two or more, if necessary.

It is not clear how the particular amine compound defined in the present invention works to achieve the effect of the invention, but is presumed as follows. Since one of $R^4$s is a phenyl-substituted $C_1$-$C_3$ hydrocarbon group, it donates an electron to the N atom and thereby promotes silica-conversion of the polysilazane compound. Meanwhile, however, the phenyl group functions as such a steric hindrance that the silica-conversion can be stopped and kept at some stage. When the composition is exposed to energy, such as, heat, plasma or light in the secondary processing, the conversion restarts to proceed to form a dense siliceous film. In the present invention, the term "siliceous film" means a film made of only silicon dioxide or a film which mainly comprises silicon dioxide and which can contain other ingredients such as silicon nitride. Similarly, the term "siliceous substance" means a substrate which mainly comprises silicon dioxide and which can contain other ingredients such as silicon nitride.

The amine compound is contained in an amount of generally 50 weight parts or less, preferably 40 weight parts or less based on 100 weight parts of the polysilazane compound. Particularly in the case where the polysilazane compound is perhydropolysilazane, in which silicon atoms link to no alkyl groups or the like, the amine compound has electronical and stereochemical advantages in working and hence can provide the effect of the present invention even in a relatively small amount. Specifically, the amount is generally 1 to 35 weight parts, preferably 1 to 32 weight parts. The amount of the amine compound is preferably more than a certain amount so as to fully obtain the catalyst effect thereof and to improve the density of the film to the utmost, but is preferably less than another certain amount so as to ensure compatibility of the composition and to avoid coating-unevenness.

(B) Polysilazane Compound

There are no particular restrictions on the polysilazane compound used in the present invention, and any polysilazane compound can be selected to use unless it impairs the effect of the invention. It may be either an inorganic polysilazane compound or an organic one. Further, it may have a straight-chain or branched-chain structure, and it may contain a cyclic moiety in the structure.

Examples thereof include: a polysilazane compound comprising a repeating unit represented by the following formula (IIa)

(in which each of $R^C$, $R^D$ and $R^E$ is independently hydrogen, an alkyl group, an alkenyl group, a cycloalkyl group, an aryl group, an alkylsilyl group, an alkylamino group, an alkoxy group, or another group, such as a fluoroalkyl group, which contains a carbon atom directly connecting to the silicon atom, provided that at least one of $R^C$, $R^D$ and $R^E$ is hydrogen atom) and having a number average molecular weight of 50 to 50000, preferably 100 to 50000; and modified compounds thereof.

For example, a polysilazane represented by the formula (IIa) in which $R^C$ and $R^D$ are hydrogens and $R^E$ is methyl can be synthesized according to a method reported by Non-patent document 2. This method provides a polysilazane of chain or cyclic polymer having a repeating unit —(SiH$_2$NCH$_3$)—, in which there is no crosslinking structure.

Further, a polyorgano(hydro)silazane represented by the formula (IIa) in which $R^C$ and $R^D$ are hydrogens and $R^E$ is an organic group can be synthesized according to a method reported by Non-patent document 2 or Patent document 8. This method provides a polysilazane of a cyclic structure having a repeating unit —($R^D$SiHNH)— with a polymerization degree of 3 to 5 or a polysilazane which has both chain and cyclic structures in a molecule and which is represented by the formula:

$(R^D SiHNH)_x[(R^D SiH)_{1.5}N]_{1-x}$ (0.4<x<1).

Polysilazanes represented by the formula (IIa) in which $R^C$ is hydrogen and $R^D$ and $R^E$ are organic groups or in which $R^C$ and $R^D$ are organic groups and $R^E$ is hydrogen include a compound of a cyclic structure comprising a repeating unit —($R^C R^D SiNR^E$)— with a polymerization degree of 3 to 5.

Examples of the polysilazane compound further include: a polyorgano(hydro)silazane (Non-patent document 3) whose molecular has a crosslinking structure represented by the formula:

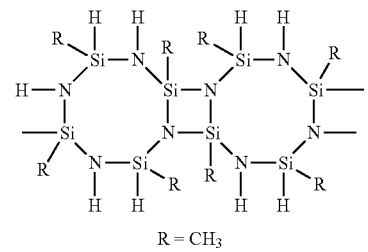

R = CH$_3$ and
a polysilazane $R^1 Si(NH)_x$ having a crosslinking structure obtained by ammonia decomposition of $R^1 SiX_3$ (X: halogen), and
a polysilazane (Patent document 9) which is obtained by cooperative ammonia decomposition of $R^1 SiX_3$ and $R^2{}_2 SiX_2$ and which is represented by the following formula:

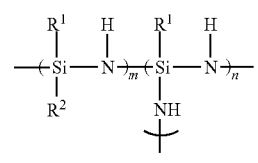

(m, n: positive integer)

The polysilazane compound may be an inorganic polysilazane, such as, perhydropolysilazane comprising a repeating unit represented by the formula (IIb):

(IIb)

Specifically, for example, the perhydropolysilazane has a straight-chain structure mainly comprising the repeating unit of the formula (IIb), has a molecular weight of 690 to 2000, contains 3 to 10 $SiH_3$ groups in a molecule thereof, and comprises Si, N and H in an element ratio of Si: 59 to 61, N: 31 to 34 and H: 6.5 to 7.5 in terms of weight percent according to chemical analysis (Patent document 7). The perhydropolysilazane may have a polystyrene-reduced average molecular weight of 3000 to 20000

The above perhydropolysilazane can be synthesized according to methods described in Patent document 7 and Non-patent document 1. The perhydropolysilazane basically comprises a chain moiety and a cyclic moiety, and can be represented by the formula:

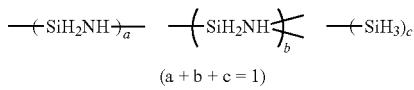

(a + b + c = 1)

The structure of perhydropolysilazane is, for example, as follows:

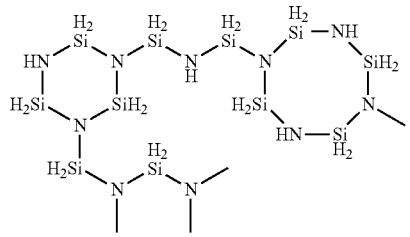

Examples of the polysilazane compound other than the above include: high polymers of inorganic silazane having increased molecular weights and/or having improved hydrolysis resistance, modified polysilazanes (described in Patent documents 10 to 15), and co-polymerized silazanes (described in Patent documents 16 to 19) which are modified to be suitable for formation of thick films by introducing organic moieties into polysilazanes. These polysilazane compounds can be used in combination of two or more.

There are no particular restrictions on the amount of the polysilazane compound in the composition. However, in order to form a siliceous film having sufficient thickness, the content of the polysilazane compound is preferably 0.1 to 40 wt %, more preferably 0.5 to 20 wt %, and further preferably 5 to 20 wt % based on the total weight of the composition. Normally, if containing the polysilazane compound in an amount of 5 to 20 wt %, the composition can form a film of generally preferred thickness, for example, of a thickness of 2000 to 8000 Å.

(C) Solvent

The composition according to the present invention contains a solvent capable of dissolving the above polysilazane compound and the above amine compound. There are no particular restrictions on the solvent as long as it can dissolve the above ingredients. Preferred examples of the solvent include:

(a) aromatic compounds, such as, benzene, toluene, xylene, ethylbenzene, diethylbenzene, trimethylbenzene, triethylbenzene and tetrahydronaphthalene; (b) saturated hydrocarbon compounds, such as, n-pentane, i-pentane, n-hexane, i-hexane, n-heptane, i-heptane, n-octane, i-octane, n-nonane, i-nonane, n-decane, i-decane, n-undecane, i-undecane, n-dodecane and i-dodecane; (c) alicyclic hydrocarbon compounds, such as ethylcyclohexane, methylcyclohexane, cyclohexane, cyclohexene, p-menthane, decahydronaphthalene, dipentene and limonene; (d) ethers, such as dipropyl ether, dibutyl ether, diethyl ether, methyl tertiary butyl ether (hereinafter, referred to as MTBE), anisole, dipentyl ether and dihexyl ether; and (e) ketones, such as methyl isobutyl ketone (hereinafter, referred to as MIBK). Among them, more preferred are (b) saturated hydrocarbon compounds, (c) alicyclic hydrocarbon compounds, (d) ethers and (e) ketones.

Those solvents can be used in combination of two or more, so as to control the evaporation rate, to reduce the hazardousness to the human body and to control the solubility of the ingredients.

It is also possible to use commercially available solvents as the solvent in the present invention. Examples of the usable commercially available solvents include: Pegasol AN45 ([trademark], manufactured by Exxon Mobil Corporation), which is an aliphatic/alicyclic hydrocarbon mixture containing an aromatic hydrocarbon of C8 or more in an amount of 5 to 25 wt %; and Exxsol D40 ([trademark], manufactured by Exxon Mobil Corporation), which is an aliphatic/alicyclic hydrocarbon mixture containing no aromatic hydrocarbon. Further, other commercially available solvents, such as, Pegasol 3040, Exxsol D80, Solvesso 100, Solvesso 150, Isopar H, Isopar L ([trademarks], manufactured by Exxon Mobil Corporation), New solvent A, Cactus fine SF-01, Cactus fine SF-02 ([trademarks], manufactured by JX Nippon Oil & Energy Corporation), Shell Sol NC311, Shell Sol MC811, Sol Eight Deluxe, and New Shell Bright Sol ([trademarks], manufactured by Shell Chemicals Japan Ltd.), are employable. If a mixture of solvents is used, it preferably contains an aromatic hydrocarbon in an amount of 30 wt % or less based on the total weight of the mixture, in view of reducing the hazardousness to the human body.

The amine compound defined in the present invention has relatively high solubility, and hence various solvents are usable. Accordingly, in consideration of safety, solvents of low volatility are preferably adopted. Particularly preferred are solvents of low volatility selected from the above-described examples, such as:

(b1) n-pentane, i-pentane, n-hexane, i-hexane, n-heptane, i-heptane, n-octane, i-octane, n-nonane, i-nonane, n-decane and i-decane;

(c1) ethylcyclohexane, methylcyclohexane, cyclohexane, cyclohexene, p-menthane and dipentene;

(d1) dipropyl ether, dibutyl ether and MTBE; and (e1) MIBK.

Further, Exxsol D40 ([trademark], manufactured by Exxon Mobil Corporation), which is described above, is also preferred.

As an indicator suggesting what solvent to select and use, vapor pressure of solvent can be adopted. Considering the relation between volatility and vapor pressure, solvents having vapor pressures of 0.8 kPa or less at 20° C. are preferably used. The vapor pressure is more preferably 0.65 kPa or less, further preferably 0.5 kPa or less. Examples of those solvents include: dibutyl ether (vapor pressure at 20° C.: 0.48 kPa), Pegasol AN45 (vapor pressure at 20° C.: 0.29 kPa), Exxsol D40 (vapor pressure at 20° C.: 0.18 kPa), Sertrex 60 (vapor pressure at 20° C.: 0.017 kPa), and Solvesso 150 (vapor pressure at 20° C.: 0.083 kPa). (Exsol D40 and Solvesso 150, as well as Pegasol AN45 and Exsol D40, are trademarks manufactured by Exxon Mobil Corporation.) Those solvents are less volatile than, for example, xylene (vapor pressure at 20° C.: 0.87 kPa), and hence less harmful to the human body.

In view of evenness of the film thickness, the composition of the present invention preferably contains at least one solvent having a boiling point of 130° C. or above. That solvent is preferably selected from the group consisting of alkyl ethers, aliphatic hydrocarbons, alicyclic hydrocarbons and aromatic hydrocarbons. The amount of the solvent having a boiling point of 130° C. or above is preferably 25 to 99 weight parts based on the total weight of the composition.

The composition of the present invention necessarily comprises the above (A) to (C), but can further comprise optional compounds in combination, if needed. Those combinable substances will be described below. The total amount of the ingredients other than (A) to (C) is preferably 10% or less, more preferably 5% or less based on the whole weight.

Other Additives

The composition according to the present invention can contain other additives, if necessary. Examples of the optional additives include a viscosity modifier and a cross-linking accelerator.

Siliceous Film Formation Process

In the process of the present invention for forming a siliceous film, the above composition is applied to coat a substrate and then converted into a siliceous film by heating or the like according to necessity.

The composition can be applied to coat the substrate surface according to known coating methods, such as spin coating, dip coating, spray coating, transfer coating, roll coating, bar coating, brush coating, doctor coating, flow coating, and slit coating. The substrate intended to be coated with the composition may be made of any materials. Examples of the substrate include a silicon one, a glass one and a resin film. If necessary, the substrate may be beforehand provided with various semiconductor elements and the like on the surface thereof. If the substrate is in the form of a film, gravure coating can be carried out. If desired, a drying step can be independently carried out after coating. Further, if necessary, the coating step may be repeatedly carried out once or twice or more so as to form a coating layer of desired thickness.

The coating layer of the composition thus formed on the substrate is then heated at 130° C. or below to remove excess of the organic solvent, if necessary. Thereafter, the coating layer is left in air to form a dry-surface film. In this stage, the polysilazane compound in the composition is incompletely converted into a siliceous substance and hence remains partially unreacted. The formed dry-surface film has surface dryness and is kept fixed on the substrate. Specifically, the "surface dryness" here means a state in which the film is solidified to such a degree that no marks are left if the surface is touched. On the other hand, "kept fixed on the substrate" here means that the film and the substrate are unified and hard to separate. Accordingly, if made of a flexible material such as a resin, the substrate coated with the dry-surface film can be wound up. Although the top surface is in touch with the back surface in the wound substrate, transfer between them is avoided. The wound substrate can be drawn out and then subjected to the subsequent treatment without any trouble. The dry-surface film is thought to show an IR spectrum chart in which the spectrum area in 1050 to 1150 cm$^{-1}$ is in a ratio (hereinafter, often referred as "SiO ratio" for simplification) of 5 to 25% inclusive based on the whole area in 700 to 4000 cm$^{-1}$. In the dry-surface film, the silica-conversion is thought to proceed little. Actually, even if the dry-surface film is left at room temperature for about one week, the SiO ratio does not increase to more than 25%.

In the present invention, a bake procedure under an oxygen-containing atmosphere is unnecessary for forming the dry-surface film.

The dry-surface film is then subjected to a secondary processing treatment selected from the group consisting of heat treatment, humidifying treatment, light irradiation treatment, UV-ozone treatment, plasma treatment, corona treatment, electron beam treatment and combinations thereof, so as to form a dense siliceous film. If the conversion is made to proceed under an atmosphere containing water-vapor, the amount of water-vapor is preferably 0.1% or more, further preferably 1% or more by volume. The secondary processing in the present invention is preferably a bake treatment carried out under an atmosphere containing a mixed gas of oxygen and water-vapor.

The amount of the amine compound can be increased so as to increase the amount of the siliceous substance in the film. The condition for forming the dry-surface film in that case is the same as that for forming the film containing a less amount of the siliceous substance. Specifically, the film is formed at room temperature.

Siliceous Film and Substrate Coated with Siliceous Film

A siliceous film according to the present invention and a substrate coated with the siliceous film can be produced from the aforementioned composition. As long as the composition of the present invention is used, there are no particular restrictions on the production conditions. For example, they can be obtained in the manner described above. The siliceous film and the siliceous film-coated substrate can be preferably used in the field of electronics to serve as, for example, an interlayer insulating film, a top-surface protective film, an optical control film and a primer for protective film. Further, in the field other than electronics, they are also useful as protective films or adhesive films of base materials such as metals, glass and plastics.

The present invention is further explained by use of the following examples

SYNTHESIS EXAMPLE 1

Synthesis of Perhydropolysilazane

According to the method described in Patent document 1, a perhydropolysilazane was synthesized as follows.

A 1-L four-neck flask equipped with a gas-inlet tube, a mechanical stirrer and a Dewar condenser was used as a reaction vessel. The vessel was filled with a dry deoxidized nitrogen gas, and then 1500 ml of dry degassed pyridine was poured therein and cooled with ice. After that, 100 g of dichlorosilane was added to the vessel, to form white solid adduct ($SiH_2Cl_2.2C_5H_5N$). While the reaction mixture was stirred and cooled with ice, 70 g of gaseous ammonia was bubbled therein. Successively, dry nitrogen gas was bubbled through the reaction liquid for 30 minutes to remove excess of the ammonia.

The formed product was subjected to reduced pressure filtration with a Buchner funnel under an atmosphere of dry nitrogen gas, to obtain 1200 ml of filtrate. From the filtrate, pyridine was distilled off by means of an evaporator to obtain 40 g of perhydropolysilazane. The number average molecular weight of the obtained perhydropolysilazane was measured by GPC (developer: $CDCl_3$), and thereby was found to be 800 in terms of polystyrene-reduced value. The IR spectrum thereof was also measured. As a result, absorption peaks assigned to N—H at 3350 and 1200 $cm^{-1}$, assigned to Si—H at 2170 $cm^{-1}$ and assigned to Si—N—Si at 1020 to 820 $cm^{-1}$ were verified.

EXAMPLES 101A to 106B and COMPARATIVE EXAMPLES 101A to 108B

In a 100 m glass beaker, 16 g of the perhydropolysilazane obtained in Synthesis Example 1 and 64 g of dibutyl ether were mixed to prepare a polysilazane solution. While the polysilazane solution was stirred with a stirrer, 0.29 g (2.4 wt % based on the weight of perhydropolysilazane) of N,N'-dibenzylethylenediamine shown in Table 1 was added to obtain a composition of Example 101A. The procedure of Example 101A was repeated except that the kind and amount of the amine compound were changed into those shown in Table 1, to obtain compositions of Examples 101B to 106B and Comparative examples 101A to 108B.

TABLE 1

| | | Amine compounds | Amount of amine compound (mmol) base on 1 g of polysilazane |
|---|---|---|---|
| Ex. | 101A | N,N'-dibenzylethylenediamine | 0.1 |
| | 101B | N,N'-dibenzylethylenediamine | 0.3 |
| | 101C | N,N'-dibenzylethylenediamine | 1.0 |
| | 101D | N,N'-dibenzylethylenediamine | 1.3 |
| | 102A | N-benzyl-N,N'-dimethylethylenediamine | 0.1 |
| | 102B | N-benzyl-N,N'-dimethylethylenediamine | 0.3 |
| | 102C | N-benzyl-N,N'-dimethylethylenediamine | 1.0 |
| | 103A | N,N'-dibenzyl-N-methyl-ethylenediamine | 0.1 |
| | 103B | N,N'-dibenzyl-N-methyl-ethylenediamine | 1.0 |
| | 104A | N,N'-dibenzyl-N,N'-dimethyl-ethylenediamine | 0.2 |
| | 104B | N,N'-dibenzyl-N,N'-dimethyl-ethylenediamine | 0.8 |
| | 105A | N-benzyl-2-methyl-1,3-propanediamine | 0.1 |
| | 105B | N-benzyl-2-methyl-1,3-propanediamine | 0.3 |
| | 105C | N-benzyl-2-methyl-1,3-propanediamine | 1.0 |
| | 106A | N,N'-dibenzyl-2-methyl-1,3-propanediamine | 0.1 |
| | 106B | N,N'-dibenzyl-2-methyl-1,3-propanediamine | 0.8 |
| Com. | 101A | benzylamine | 0.1 |
| | 101B | benzylamine | 3.0 |
| | 102A | dibenzylamine | 0.1 |
| | 102B | dibenzylamine | 2.0 |
| | 103A | ethylenediamine | 0.1 |
| | 103B | ethylenediamine | 1.0 |
| | 104A | N,N,N',N'-tetramethyl-1,6-diaminohexane | 0.1 |
| | 104B | N,N,N',N'-tetramethyl-1,6-diaminohexane | 1.0 |
| | 105A | N,N'-diphenylethylenediamine | 0.1 |
| | 105B | N,N'-diphenylethylenediamine | 1.0 |
| | 106A | N,N'-di-sec-butyl-1,4-phenylenediamine | 0.1 |
| | 106B | N,N'-di-sec-butyl-1,4-phenylenediamine | 1.0 |
| | 107A | N,N'-bis(2-aminoethyl)-1,3-propanediamine | 0.1 |
| | 107B | N,N'-bis(2-aminoethyl)-1,3-propanediamine | 1.0 |
| | 108A | 4,4'-diaminodiphenylmethane | 0.1 |
| | 108B | 4,4'-diaminodiphenylmethane | 1.0 |

Among the above, homogeneous compositions were selected. Each homogeneous composition was then spin-coated (500 rpm/5 seconds and then 1000 rpm/20 seconds) on a PEN (polyethylene naphthalate) film of 125 nm-thickness, to obtain a composition layer of 200 nm-thickness. The formed layer was visually observed to check whether or not there were any coating defects thereon, and thereby the coating property of the composition was evaluated. If coating defects were not found, the composition was graded as "a". If found, it was graded as "b". Subsequently, the layer was baked in an oven at 100° C. for 3 minutes under atmospheric conditions. For the purpose of evaluating the surface dryness of the composition, the surface of the baked layer was then touched with a finger and then observed whether or not marks of the finger were left there. If the touching marks were found, the composition was graded as "B". If not, it was graded as "A". The results are shown in Table 2. Even if the amounts of the amine compounds were increased, the compositions of Examples exhibited excellent results in both coating property and surface dryness. On the other hand, however, those of Comparative examples did not. Independently, a composition containing no amine compound was prepared, and the surface dryness thereof was evaluated and found to be "B". Further, the layer thereof did not come to have the surface dryness of "A" even if left for several days.

The procedure of Example 101C was repeated except for changing the solvent from dibutyl ether to xylene, n-pentane, i-pentane, n-hexane, i-hexane, n-heptane, i-heptane, n-octane, i-octane, n-nonane, i-nonane, n-decane, i-decane, n-dodecane, i-dodecane, ethylcyclohexane, methylcyclohexane, cyclohexane, cyclohexene, p-menthane, decahydronaphthalene, tetrahydronaphthalene, a mixed solvent of xylene and n-nonane, or a mixed solvent of xylene and dodecane, to produce compositions. The compositions were then evaluated on the coating property and the surface dryness in the same manner as the above, and consequently found to show the same excellent results as the above Examples.

Figure 2:
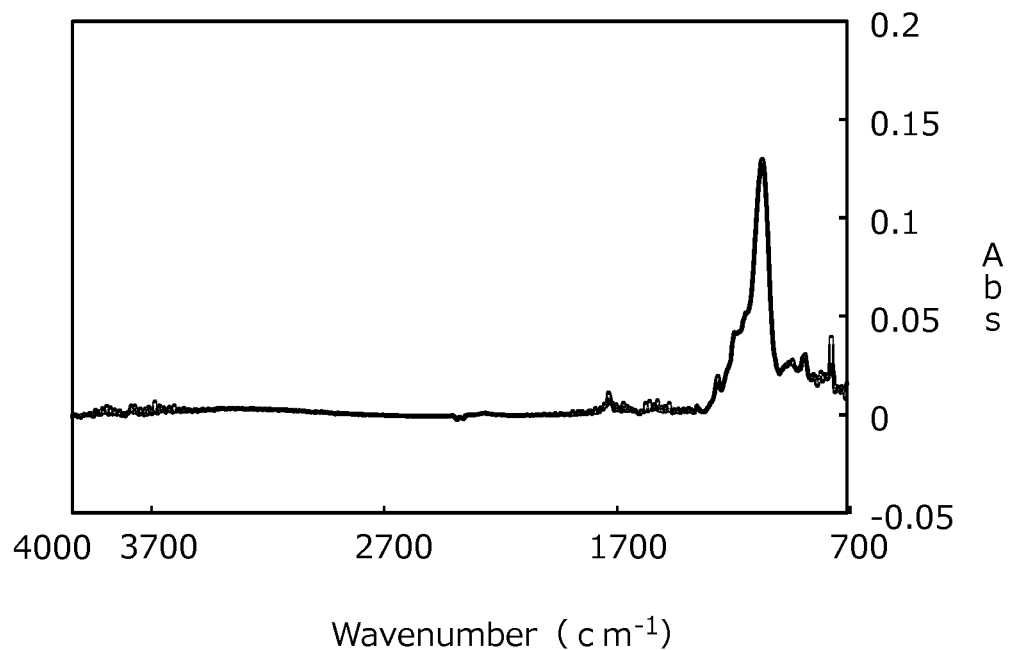
FIG. 2 shows a typical IR spectrum of a film containing a large amount of the siliceous substance.

After baked in an oven, each composition was left at room temperature. After 1 day and 7 days, the IR spectrum was measured to evaluate how far the composition was converted into a siliceous substance. A film of the siliceous substance obtained by the conversion generally shows an IR spectrum having absorption peaks assigned to Si—O bond approx. at 1030 $cm^{-1}$ and 450 $cm^{-1}$, assigned to Si—C bond approx. at 1270 $cm^{-1}$ and 780 $cm^{-1}$ and assigned to C—H bond approx. at 2970 $cm^{-1}$. On the other hand, the peaks shown before the conversion, that is, those assigned to N—H bond approx. at 3350 $cm^{-1}$ and 1200 $cm^{-1}$ and assigned to Si—H bond approx. at 2200 $cm^{-1}$ are not observed. Accordingly, it is possible to verify whether or not the composition layer is converted into a siliceous film. FIGS. 1 and 2 show typical IR spectra of films containing small and large amounts of the siliceous substance, respectively. The SiO ratios in FIGS. 1 and 2 were 11.3% and 46.9%, respectively.

With respect to Examples and Comparative examples, the SiO ratios were individually calculated on the basis of the IR spectra thereof. The results are shown in Table 2, in which "α" and "β" represent SiO ratios of 5 to 25% inclusive and 40% or more, respectively. Further, "NA" in the table means that the film was not dried enough to measure the IR spectrum.

As shown in Table 2, some samples were evaluated as "α" both after 1 and 7 days. This indicates that they formed dry-surface films and that the films kept the state thereof. Meanwhile, some samples in which the amine compounds were added in increased amounts were evaluated as "β" both after 1 and 7 days. This means that they formed films containing the siliceous substance in increased amounts according to the increase of the amine compound contents.

The films in the state of "α" or "β" can be subjected to secondary processing for enhancing the content of the siliceous substance. For example, the dry-surface film obtained in Example 101b of Table 2 was graded as "α" on the basis of the IR spectrum. That film was subsequently subjected to heating and humidifying treatments for 24 hours under conditions of 80° C. and a relative humidity of 95%. Thereafter, the IR spectrum thereof was measured again to find a SiO ratio of 49.5%. This SiO ratio corresponds to the state of "β", which indicates sufficient progress of the conversion into the siliceous substance. Accordingly, this means that first the composition layer was converted into a film in the state of "α" (first step of the conversion), then that the film kept the state "α", and finally that the film was further converted to be in the state of "β" (second step of the conversion) by the heating and humidifying treatments. Independently, a film having a SiO ratio of 49.2%, which corresponds to the state of "β", was also subjected to the humidifying treatment, and the resultant film was found to have a SiO ratio of 58.9%. This means that the film in the state of "β" was brought to contain a higher amount of the siliceous substance by the second processing.

TABLE 2

|  |  | Coating property | Surface dryness | SiO ratio % | | | |
|---|---|---|---|---|---|---|---|
|  |  |  |  | after 1 day | | after 7 days | |
| Ex. | 101A | a | A | 8.3 | α | 16.4 | α |
|  | 101B | a | A | 14.4 | α | 19.7 | α |
|  | 101C | a | A | 45.0 | β | 48.0 | β |
|  | 101D | a | A | 46.8 | β | 51.9 | β |
|  | 102A | a | A | 12.6 | α | 18.9 | α |
|  | 102B | a | A | 19.8 | α | 22.7 | α |
|  | 102C | a | A | 49.8 | β | 59.4 | β |
|  | 103A | a | A | 13.4 | α | 21.7 | α |
|  | 103B | a | A | 48.9 | β | 59.5 | β |
|  | 104A | a | A | 16.2 | α | 22.1 | α |
|  | 104B | a | A | 50.4 | β | 59.9 | β |
|  | 105A | a | A | 19.4 | α | 18.9 | α |
|  | 105B | a | A | 45.9 | β | 50.2 | β |
|  | 105C | a | A | 53.7 | β | 58.2 | β |
|  | 106A | a | A | 16.8 | α | 13.5 | α |
|  | 106B | a | A | 53.3 | β | 56.5 | β |
| Com. | 101A | a | B | 8.4 | α | 12.2 | α |
|  | 101B | a | B | 16.9 | α | 20.2 | α |
|  | 102A | a | B | 10.1 | α | 12.2 | α |
|  | 102B | a | B | 13.6 | α | 16.1 | α |
|  | 103A | a | B | NA | NA | NA | NA |
|  | 103B | b | A | 15.3 | α | 23.2 | α |
|  | 104A | a | B | NA | NA | 13.9 | α |
|  | 104B | b | A | 11.9 | α | 53.4 | β |
|  | 105A | a | B | NA | NA | NA | NA |
|  | 105B | a | B | NA | NA | NA | NA |
|  | 106A | a | B | NA | NA | NA | NA |
|  | 106B | a | B | NA | NA | NA | NA |
|  | 107A | a | B | NA | NA | 56.2 | β |
|  | 107B | b | A | 12.4 | α | 66.1 | β |
|  | 108A | a | B | 7.4 | α | 15.9 | α |
|  | 108B | b | B | NA | NA | 21.8 | α |

The invention claimed is:
1. A composition comprising:
a) an amine compound represented by the following formula (I):

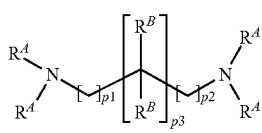

in which
each $R^A$ is independently hydrogen or a substituted or unsubstituted $C_1$-$C_{10}$ hydrocarbon group provided that at least one $R^A$ is a phenyl-substituted $C_1$-$C_3$ hydrocarbon group,
each $R^B$ is independently hydrogen or $C_1$-$C_{10}$ hydrocarbon group, cyclic hydrocarbon group or unsaturated hydrocarbon group provided that both $R^B$s are not hydrogens at the same time,
each of p1 and p2 is independently an integer of 0 to 3, and p3 is an integer of 1 to 3;
b) a polysilazane compound;
and
c) a solvent.

2. The composition according to claim 1, wherein said amine compound is represented by the formula (I) in which at least one of said $R^A$s is a benzyl group.

3. The composition according to claim 1, wherein said polysilazane compound comprises a repeating unit represented by the following formula (IIa):

in which
each of $R^C$, $R^D$ and $R^E$ is independently hydrogen, an alkyl group, an alkenyl group, a cycloalkyl group, an aryl group, an alkylsilyl group, an alkylamino group, an alkoxy group, or a fluoroalkyl group, which contains a carbon atom directly connecting to the silicon atom, provided that at least one of $R^C$, $R^D$ and $R^E$ is hydrogen atom,
and has a number average molecular weight of 50 to 50000.

4. The composition according to claim 2, wherein said polysilazane compound comprises a repeating unit represented by the following formula (IIa):

in which
each of $R^C$, $R^D$ and $R^E$ is independently hydrogen, an alkyl group, an alkenyl group, a cycloalkyl group, an aryl group, an alkylsilyl group, an alkylamino group, an alkoxy group, a fluoroalkyl group, which contains a carbon atom directly connecting to the silicon atom, provided that at least one of $R^C$, $R^D$ and $R^E$ is hydrogen atom,
and has a number average molecular weight of 50 to 50000.

5. The composition according to claim 1, which contains said amine compound in an amount of 1 to 35 weight parts based on 100 weight parts of said polysilazane compound.

6. The composition according to claim 1, wherein said polysilazane compound is perhydropolysilazane.

7. The composition according to claim 1, which contains said polysilazane compound in an amount of 0.01 to 30 weight parts based on 100 weight parts of said composition.

8. The composition according to claim 5, wherein said polysilazane compound is perhydropolysilazane.

9. The composition according to claim 8, which contains said polysilazane compound in an amount of 0.01 to 30 weight parts based on 100 weight parts of said composition.

10. The composition according to claim 1, wherein said solvent is selected from the group consisting of alkyl ethers, aliphatic hydrocarbons, aliphatic cyclic hydrocarbons and aromatic hydrocarbons, and has a boiling point of 130° C. or above.

11. The composition according to claim 9, wherein said solvent is selected from the group consisting of alkyl ethers, aliphatic hydrocarbons, aliphatic cyclic hydrocarbons and aromatic hydrocarbons, and has a boiling point of 130° C. or above.

12. A process for forming a siliceous film, which comprises the steps of: coating a substrate with the composition according to claim 1, to form a film having surface dryness; and then subjecting the film to a treatment selected from the group consisting of heat treatment, humidifying treatment, light irradiation treatment, UV-ozone treatment, plasma treatment, corona treatment, electron beam treatment, and combinations thereof.

13. A process for forming a siliceous film, which comprises the steps of: coating a substrate with the composition according to claim 11, to form a film having surface dryness; and then subjecting the film to a treatment selected from the group consisting of heat treatment, humidifying treatment, light irradiation treatment, UV-ozone treatment, plasma treatment, corona treatment, electron beam treatment, and combinations thereof.

* * * * *